(12) United States Patent
Chen et al.

(10) Patent No.: US 11,723,294 B2
(45) Date of Patent: Aug. 8, 2023

(54) MEMORY DEVICE AND METHOD FOR FABRICATING THE SAME

(71) Applicant: TAIWAN SEMICONDUCTOR MANUFACTURING CO., LTD., Hsinchu (TW)

(72) Inventors: Hsia-Wei Chen, Taipei (TW);
Chih-Hung Pan, Taichung (TW);
Chih-Hsiang Chang, Taichung (TW);
Yu-Wen Liao, New Taipei (TW);
Wen-Ting Chu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 354 days.

(21) Appl. No.: 16/912,341

(22) Filed: Jun. 25, 2020

(65) Prior Publication Data

US 2021/0408373 A1    Dec. 30, 2021

(51) Int. Cl.
*H10N 70/00* (2023.01)
*H10B 63/00* (2023.01)
*H10N 70/20* (2023.01)

(52) U.S. Cl.
CPC ....... *H10N 70/8416* (2023.02); *H10N 70/023* (2023.02); *H10B 63/30* (2023.02); *H10B 63/80* (2023.02); *H10N 70/063* (2023.02); *H10N 70/24* (2023.02); *H10N 70/826* (2023.02)

(58) Field of Classification Search
CPC ............ H01L 45/1266; H01L 45/1616; H01L 27/2436; H01L 27/2463; H01L 45/08; H01L 45/1233; H01L 45/1675; H01L 45/146; H01L 45/1633; H01L 45/16; H01L 45/1666; H01L 45/1253; H10N 70/8416; H10N 70/023; H10N 70/063; H10N 70/24; H10N 70/826; H10N 70/028; H10N 70/8833; H10N 70/061; H10N 70/011; H10N 70/841; H10B 63/30; H10B 63/80
See application file for complete search history.

(56) References Cited

U.S. PATENT DOCUMENTS

| | | | |
|---|---|---|---|
| 9,112,138 | B2 * | 8/2015 | Ramaswamy ........ H01L 45/145 |
| 2014/0284538 | A1 | 9/2014 | Chen et al. |
| 2019/0214559 | A1 * | 7/2019 | Clarke ................ H01L 27/2463 |

FOREIGN PATENT DOCUMENTS

| | | |
|---|---|---|
| DE | 10 2018 108 798 A1 | 12/2018 |
| DE | 10 2019 100 488 A1 | 3/2020 |
| JP | 2016-192510 A | 11/2016 |
| KR | 10-2008-0000358 A | 1/2008 |
| KR | 10-2013-0047230 A | 5/2013 |
| KR | 10-2018-0103253 A | 9/2018 |

(Continued)

*Primary Examiner* — Allison Bernstein
(74) *Attorney, Agent, or Firm* — Birch, Stewart, Kolasch & Birch, LLP

(57) ABSTRACT

A method for fabricating a memory device is provided. The method includes forming a bottom electrode layer over a substrate; forming a buffer layer over the bottom electrode layer; performing a surface treatment to a top surface of the buffer layer; depositing a resistance switch layer over the top surface of the buffer layer after performing the surface treatment; forming a top electrode over the resistance switch layer; and patterning the resistance switch layer into a resistance switch element below the top electrode.

20 Claims, 18 Drawing Sheets

(56) References Cited

FOREIGN PATENT DOCUMENTS

| KR | 10-2019-0001555 A | 1/2019 |
| KR | 10-2020-0034920 A | 4/2020 |
| TW | 201810749 A | 3/2018 |
| TW | 201623673 A | 7/2018 |

* cited by examiner

ABSTRACT# MEMORY DEVICE AND METHOD FOR FABRICATING THE SAME

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, RRAM cell includes a resistance switch layer, the resistance of which can be adjusted to represent logic "0" or logic "1."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
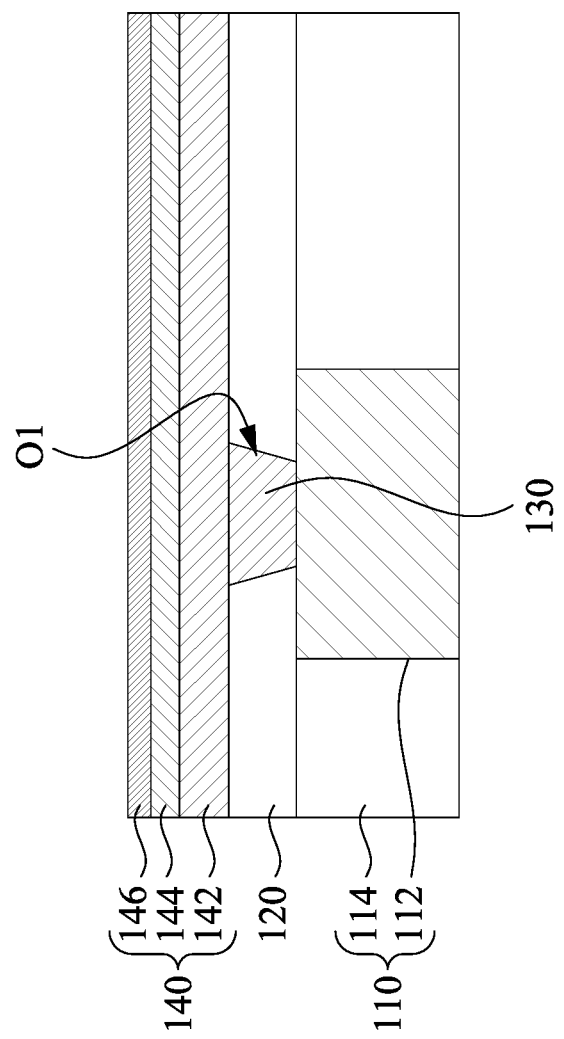
FIGS. 1-8 illustrate various stages in the formation of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random-access memory (RRAM) devices have a bottom electrode that is separated from an overlying top electrode by a dielectric data storage layer having a variable resistance. RRAM devices are configured to store data based on a resistive state of the dielectric data storage layer. For example, the dielectric data storage layer may have a high resistance state associated with a first data state (e.g., a '0') or a low resistance state associated with a second data state (e.g., a '1').

During operation of an RRAM device, bias voltages are applied to the bottom and top electrodes to reversible change a resistive state of the dielectric data storage layer. The bias voltages change the resistive state of the dielectric data storage layer by controlling the movement of oxygen between the electrodes and the dielectric data storage layer to either form or break conductive filaments extending through the dielectric data storage layer. For example, a first set of bias voltages may induce conductive paths/filaments (e.g., chains of oxygen vacancies) to form across the dielectric data storage layer to achieve a low resistance state, while a second set of bias voltages may break conductive paths/filaments within the dielectric data storage layer to achieve a high resistance state.

It has been appreciated that when forming a conductive filament to achieve a low resistive state, the bias voltages may cause oxygen from the dielectric data storage layer to move to deep within a top electrode and/or within an overlying layer. However, if oxygen moves far away from the dielectric data storage layer, it can be difficult to pull the oxygen back to dielectric data storage layer to subsequently break the conductive filament. As an RRAM device is operated over many cycles, the amount of oxygen moved to deep within the top electrode and/or the overlying layer increases, which in turn will damage the dielectric data storage layer and result in hard reset bit (HRB) issue, eventually leading to RRAM failure.

Embodiments of the present disclosure relates to a RRAM device having a dielectric data storage layer formed over a treated surface, in which the treated surface has an increased amount of oxide vacancies. By increasing the amount of oxide vacancies of the surface, the amount of oxide vacancies in the dielectric data storage layer is increased, such that the oxygen can be kept close to the dielectric data storage layer and a reliability of the RRAM device can be improved.

A RRAM device and the method of forming the same are provided in accordance with various exemplary embodiments. The intermediate stages of forming the RRAM device are illustrated. The variations of the embodiments are discussed. Throughout the various views and illustrative embodiments, like reference numbers are used to designate like elements.

FIGS. 1-8 illustrate various stages in the formation of a memory device according to some embodiments of the present disclosure. The illustration is merely exemplary and is not intended to limit beyond what is specifically recited in the claims that follow. It is understood that additional operations may be provided before, during, and after the operations shown by FIGS. 1-8, and some of the operations described below can be replaced or eliminated for additional embodiments of the method. The order of the operations/processes may be interchangeable.

FIG. 1 illustrates a semiconductor substrate having transistors and one or more metal/dielectric layers 110 thereon. The semiconductor substrate may be a silicon substrate.

Alternatively, the substrate may include another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. The transistors are formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers 110 of a multi-level interconnect (MLI) is formed over the transistors.

The metal/dielectric layer 110 includes one or more conductive features 112 embedded in an inter-layer dielectric (ILD) layer 114. The ILD layer 114 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The conductive features 112 may be aluminum, aluminum alloy, copper, copper alloy, titanium, titanium nitride, tantalum, tantalum nitride, tungsten, cobalt, the like, and/or combinations thereof. The substrate may also include active and passive devices, for example, underlying the metal/dielectric layers 110. These further components are omitted from the figures for clarity.

A dielectric layer 120 may be formed on the metal/dielectric layer 110. The dielectric layer 120 may be silicon carbide, silicon oxynitride, silicon nitride, carbon doped silicon nitride or carbon doped silicon oxide. The dielectric layer 120 may include one or plural layers. In some embodiments, a material of a top layer of the dielectric layer 120 is selected to have a chemical mechanical polishing (CMP) resistance property different from that of a bottom electrode material formed in subsequent processes. The dielectric layer 120 is deposited over the metal/dielectric layer 110 using a chemical vapor deposition (CVD) process such as plasma enhanced (PE) CVD, high-density plasma (HDP) CVD, inductively-coupled-plasma (ICP) CVD, or thermal CVD.

Bottom electrode vias (BEVA) 130 are formed in the dielectric layer 120. An exemplary formation method of the BEVAs 130 includes etching an opening O1 in the dielectric layer 120 and exposing a portion of the conductive feature 112, and filling the opening O1 with suitable conductive materials, thereby forming the BEVA 130. In some embodiments, after filling the opening O1 with the materials, a planarization process, such as a chemical-mechanical polish (CMP) process, is performed to remove excess conductive materials outside the opening O1. In some embodiments, the BEVA is electrically connected to an underlying electrical component, such as a transistor, through the conductive feature 112.

In some embodiments, the BEVA 130 is a multi-layered structure and includes, for example, a diffusion barrier layer and a filling metal filling a recess in the diffusion barrier layer. In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the filling metal is titanium (Ti), tantalum (Ta), platinum (Pt), ruthenium (Ru), tungsten (W), aluminum (Al), copper (Cu), TiN, TaN, the like, and/or combinations thereof. Formation of the filling metal may be exemplarily performed using CVD, PVD, ALD, the like, and/or a combination thereof.

A bottom electrode stack layer 140 is then formed over the BEVA 130 and over the dielectric layer 120, so that the bottom electrode stack layer 140 extends along a top surface of the BEVA 130 and top surfaces of the dielectric layer 120. The bottom electrode stack layer 140 can be a single-layered structure or a multi-layered structure. For example, the bottom electrode stack layer 140 includes a first electrode layer 142, a second electrode layer 144 over the first electrode layer 142, and a buffer layer 146 over the second electrode layer 144.

In some embodiments, the first electrode layer 142 may include titanium (Ti), tantalum (Ta), platinum (Pt), ruthenium (Ru), tungsten (W), aluminum (Al), copper (Cu), TiN, TaN, the like, and/or a combination thereof. Formation of the first electrode layer 142 may be exemplarily performed using CVD, PVD, ALD, the like, and/or a combination thereof.

In some embodiments, the second electrode layer 144 is formed over the first electrode layer 142. The second electrode layer 144 may include a material different from that of the first electrode layer 142. For example, the second electrode layer 144 may include Ru, Ti, W, Ni, Al, Pd, Co, or the combination thereof. In some embodiments, the second electrode layer 144 may be more inactive than the first electrode layer 142. For example, the second electrode layer 144 may be more inert to oxygen than the first electrode layer 142 is. In some embodiments, the second electrode layer 144 may include noble metals, while the first electrode layer 142 may include non-noble metals. For example, the second electrode layer 144 may include Ru, Pd, or the like, and the first electrode layer 142 may include Ti, Ta, Al, W, TiN, TaN or the like. The second electrode layer 144 may be deposited by ALD. Alternatively, the second electrode layer 144 is deposited by an electroless plating process or other suitable process.

In some embodiments, the buffer layer 146 is formed over the second electrode layer 144. The buffer layer 146 may include a material different from that of the second electrode layer 144. In some embodiments, the buffer layer 146 may be more active than the second electrode layer 144. For example, in some embodiments, the buffer layer 146 may include non-noble metals, while the second electrode layer 144 may include noble metals. For example, the buffer layer 146 may include tantalum, TaN, or the combination thereof. The buffer layer 146 may deposited by ALD. Alternatively, the buffer layer 146 is deposited by an electroless plating process or other suitable process. The buffer layer 146 may have a thickness in a range of about 5 angstroms to about 20 angstroms. If the thickness of the buffer layer 146 is greater than about 20 angstroms, a forming voltage for triggering the RRAM device may be too large to be bear by the gate oxide of a logic device, which derives the demands of high voltage logic devices, which may occupy more chip area. If the thickness of the buffer layer 146 is less than about 5 angstroms, the subsequent surface treatment performed to the top surface 146T of the buffer layer 146 may not make the top surface 146T include defects, which in turn will fail the improvement on the cycling of the resistance switch layer 150 (referring to FIG. 3) to be formed.

Figure 2:
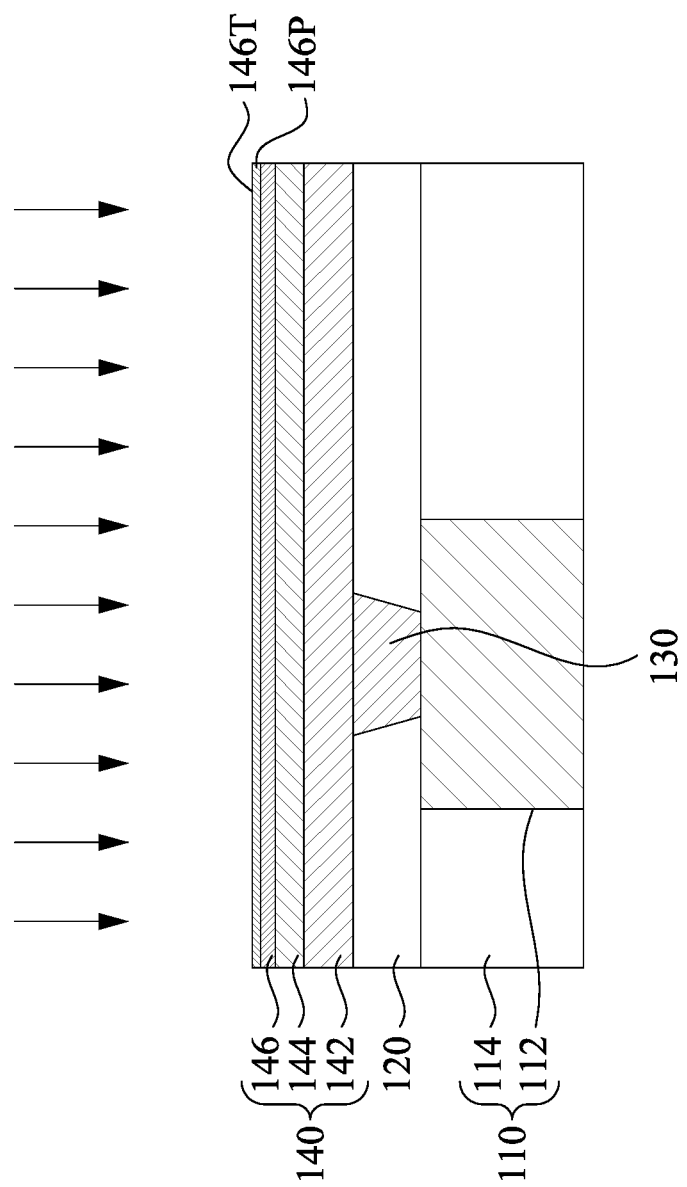

Reference is made to FIG. 2. A surface treatment is performed to a top surface 146T of the buffer layer 146 by inducing a gas or plasma to the top surface 146T of the buffer layer 146. The gas or plasma may include oxide-containing gas or nitrogen-containing gas. For example, the gas or plasma may include $O_2$ or $N_2O$. In some embodiments, the surface treatment may be performed in ex-situ chamber after the formation of the buffer layer 146. After the surface treatment, the top surface 146T of the buffer layer 146 may include defects, such as dangling bonds or oxide vacancies. In other word, the surface treatment may create oxide vacancies over a top surface of the bottom electrode stack layer 140.

In some embodiments, the surface treatment may turn a top portion of the buffer layer 146 adjoining the top surface 146T into a metal-containing compound layer. For example, the surface treatment may oxidize a top portion of the buffer layer 146 adjoining the top surface 146T. The oxidized top portion of the buffer layer 146 may referred to as a metal-containing oxide layer 146P hereinafter. The metal-containing oxide layer 146P may have a same metal as that included in the buffer layer 146. The metal included in the metal-containing oxide layer 146P and the buffer layer 146 may be a non-noble metal. For example, while the buffer layer 146 include tantalum or TaN, the metal-containing oxide layer 146P may include TaO. A thickness of the metal-containing oxide layer 146P may be several angstroms, for example, in a range from about 3 angstroms to about 8 angstroms. In some embodiments, the metal-containing oxide layer 146P is observable by TEM and/or EDX analysis. Sometimes, in alternative embodiments, the metal-containing oxide layer 146P may be too thinned to be observed.

In some embodiments, the surface treatment using the oxide-containing gas (e.g., $O_2$) is performed in a chemical vapor deposition (CVD) chamber with a power ranging from about 5 W to about 800 W and a time duration ranging from about 3 seconds to about 50 seconds. If the power is greater than about 800 W or the time duration is greater than about 50 seconds, the resistance switch layer 150 (referring to FIG. 3) to be formed may have leakage issues, which may fail the RRAM device. If the power is less than about 5 W or the time duration is less than about 3 seconds, the cycling of the resistance switch layer 150 (referring to FIG. 3) to be formed may not be effectively improved.

In some embodiments, the surface treatment using the nitrogen-containing gas (e.g., $N_2O$) is performed in a chemical vapor deposition (CVD) chamber with a power ranging from about 5 W to about 600 W and a time duration ranging from about 3 seconds to about 50 seconds. If the power is greater than about 600 W or the time duration is greater than about 50 seconds, the resistance switch layer 150 (referring to FIG. 3) to be formed may have leakage issues, which may fail the RRAM device. If the power is less than about 5 W or the time duration is less than about 3 seconds, the cycling of the resistance switch layer 150 (referring to FIG. 3) to be formed may not be effectively improved.

Figure 3:
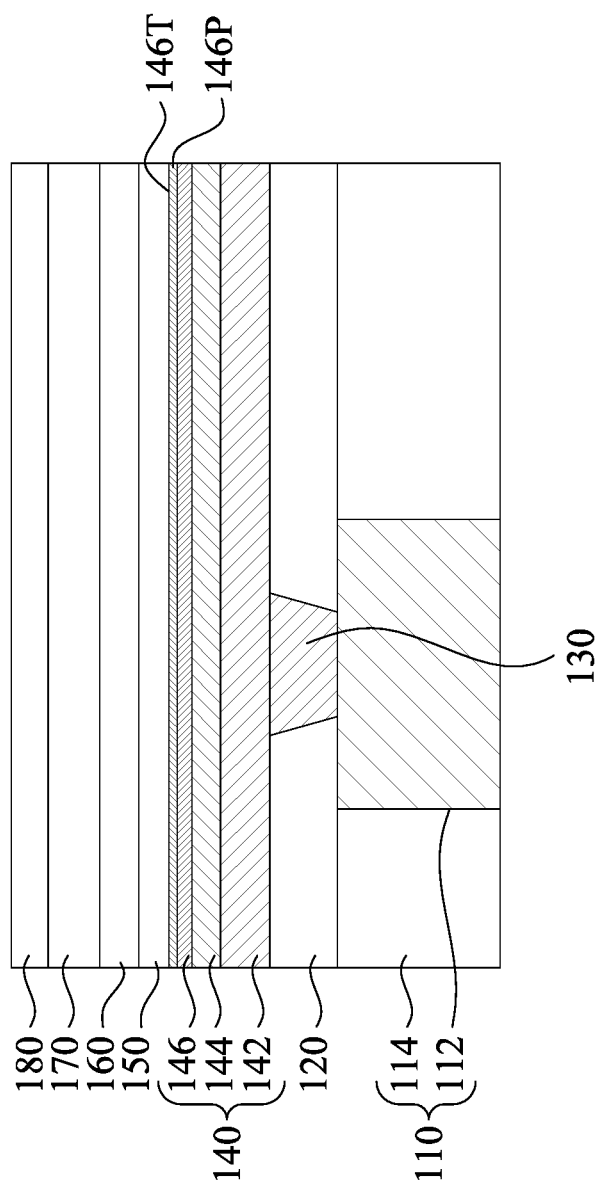

Reference is made to FIG. 3. A resistance switch layer 150, a capping layer 160, a top electrode layer 170, and a hardmask layer 180 are subsequently formed on the top surface 146T. In some embodiments where the metal-containing oxide layer 146P is observable, the resistance switch layer 150 may be in contact with the metal-containing oxide layer 146P. The deposited resistance switch layer 150 may be spaced apart from the buffer layer 146 of the bottom electrode stack layer 140 by the metal-containing oxide layer 146P. In some embodiments where the metal-containing oxide layer 146P is unobservable, the resistance switch layer 150 may be in contact with the buffer layer 146. The resistance switch layer 150 includes a material having a variable resistance configured to undergo a reversible phase change between a high resistance state and a low resistance state. For example, the resistance switch layer 150 may include high-k dielectric films. In some embodiments, the resistance switch layer 150 is a metal oxide, which may be hafnium oxide, zirconium oxide, aluminum oxide, nickel oxide, tantalum oxide, titanium oxide, and other oxides used as a resistance switch layer. The metal oxide may have a non-stoichiometric oxygen to metal ratio. Depending on the method of deposition, the oxygen to metal ratio and other process conditions may be tuned to achieve specific resistance switch layer 150 properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistance switch layer is a metal oxynitride.

The resistance switch layer 150 may be formed by a suitable technique, such as atomic layer deposition (ALD) with a precursor containing a metal and oxygen. Other chemical vapor deposition (CVD) techniques may be used. In another example, the resistance switch layer 150 may be formed by a physical vapor deposition (PVD), such as a sputtering process with a metallic target and with a gas supply of oxygen and optionally nitrogen to the PVD chamber. In yet another example, the resistance switch layer 150 may be formed by an electron-beam deposition process.

In some cases, when a formed RRAM device is operated over many cycles, oxygen may move far away from the resistance switch layer 150, and it can be difficult to pull the oxygen back to the resistance switch layer 150 to subsequently break the conductive filament, which in turn will damage the dielectric data storage layer and result in hard reset bit (HRB) issue, eventually leading to RRAM failure.

In some embodiments of the present disclosure, by increasing the amount of oxide vacancies of the surface 146T where the resistance switch layer 150 is formed on, the amount of oxide vacancies in the resistance switch layer 150 is increased. Through the configuration, when a formed RRAM device is operated, it can be easier to pull the oxygen back to the resistance switch layer 150 to subsequently break the conductive filament, and therefore improving the reliability of the RRAM device.

In various embodiments, the capping layer 160 over the resistance switch layer 150 is a metal, for example, titanium, hafnium, platinum, ruthenium or tantalum. In some embodiments, the capping layer may include hafnium oxide, aluminum oxide, tantalum oxides, other metal oxidation composite layers, or the combination thereof. The capping layer 160 may be deposited using a PVD process, a CVD, or an ALD process.

The top electrode layer 170 may be metal, metal-nitride, doped polysilicon or other suitable conductive material. For example, the top electrode layer 170 may be tantalum nitride, titanium nitride, titanium, tantalum or platinum. The top electrode layer 170 may single or bilayer. The top electrode layer 170 may be formed by PVD, CVD, ALD, or other suitable technique. Alternatively, the top electrode layer 170 includes other suitable conductive material to electrically connect the device to other portion of an interconnect structure for electrical routing. In some embodiments, the capping layer 160 and the top electrode layer 170 may be formed of the same material, but using different processes so as to vary a specific material property. In other embodiments, the capping layer 160 is a metal and the top electrode layer 170 is a metal nitride, for example, the capping layer 160 may be titanium and the top electrode layer 170 may be a tantalum nitride.

The hardmask layer 180 may be made of silicon nitride, silicon carbide, or other composite dielectric layers. In some embodiments, a silicon oxynitride is used. Silicon oxynitride has a good etch selectivity against the bottom electrode metal. Other hardmask material including silicon carbide, carbon-doped silicon nitride, or silicon nitride may be used.

Figure 4:
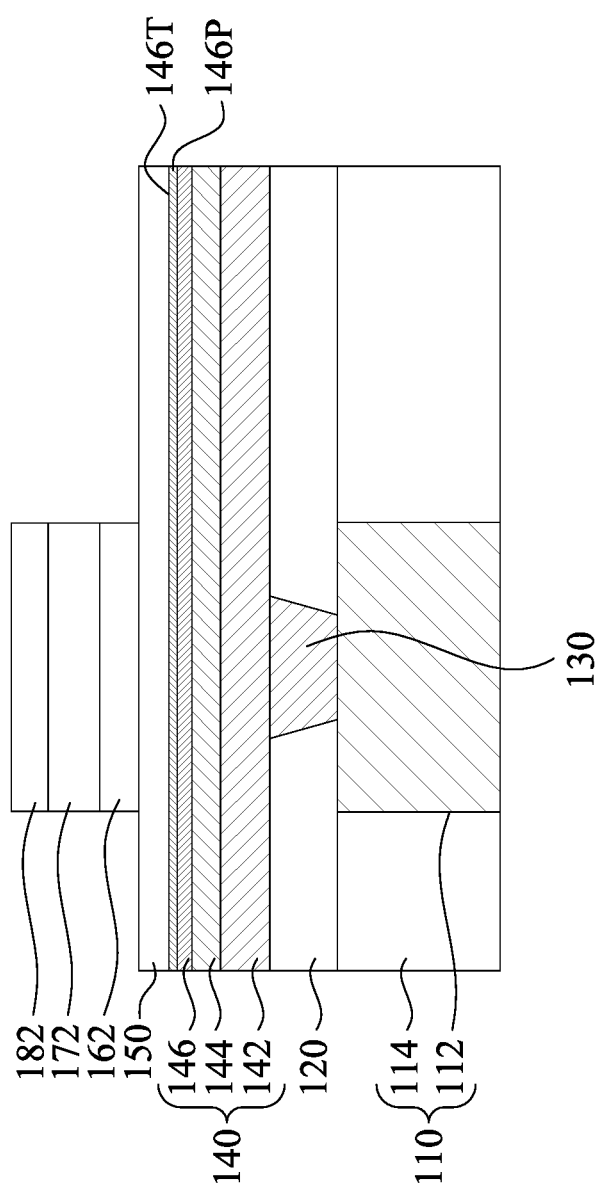

Reference is made to FIG. 4. The hardmask layer 180, the top electrode layer 170, and the capping layer 160 (referring to FIG. 3) are patterned into a hardmask 182, a top electrode 172, a capping layer 162, respectively. The patterning process may include a photolithography operation where a photoresist is deposited over the hardmask layer 180 (referring to FIG. 3), a pattern is defined by exposing photoresist to a radiation, and developing the photoresist to create a photoresist pattern. The photoresist pattern is then used as an etch mask to protect desired portions of the hardmask layer 180 (referring to FIG. 3). The hardmask layer 180 (referring to FIG. 3) may then be patterned using an etching operation. In some embodiments, an etchant used to pattern the hardmask layer 180 (referring to FIG. 3) includes an etching chemistry including gases of $CF_4$, $CH_2F_2$ and/or other chemicals. The photoresist mask is removed after the patterning. In some embodiments, the photoresist mask can be removed by adding oxygen to the etchant. Subsequently, the hardmask 182 is used as an etchmask to pattern the top electrode layer 170 and the capping layer 160. In some embodiments, an etchant is applied to etch an exposed portion of the top electrode layer 170 and the capping layer 160 that is not covered by the hardmask 182. The etch process stops when the resistance switch layer 150 is reached. Techniques are available to detect the end of etching when a new material layer is reached so as to reduce the amount of over etching.

Figure 5:
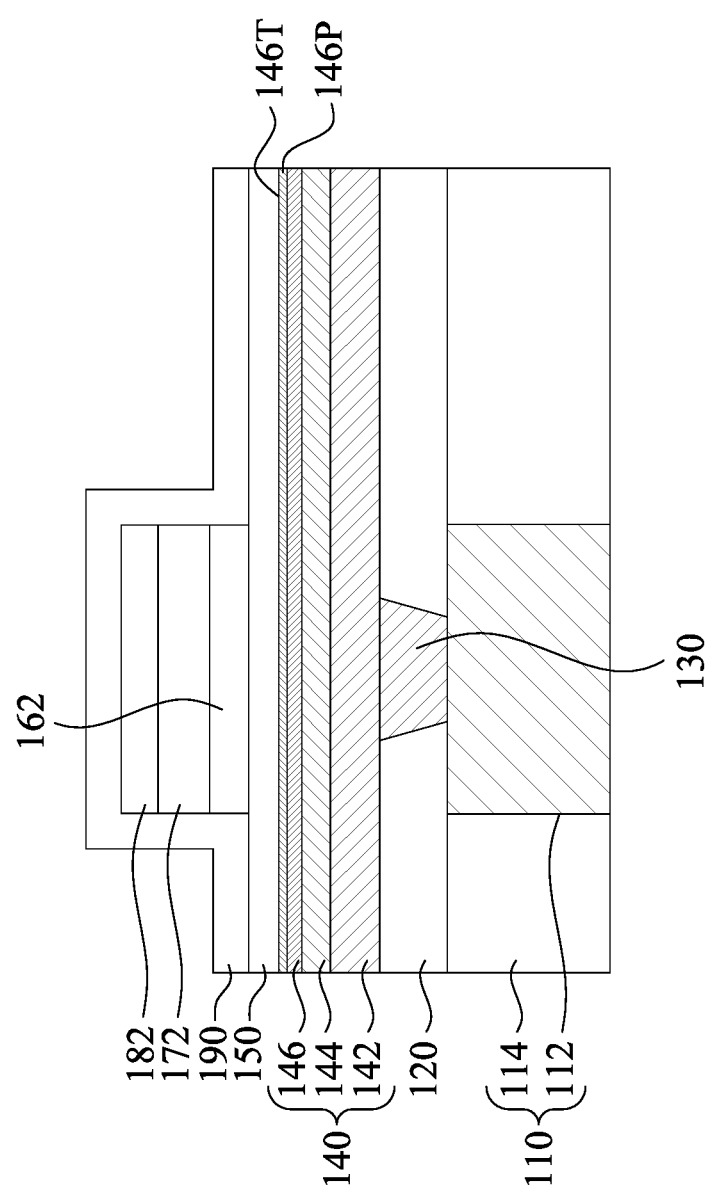

Reference is made to FIG. 5. A spacer layer 190 is deposited over the hardmask 182 and the resistance switch layer 150. The spacer layer 190 may be made of silicon nitride, silicon oxynitride, and silicon oxide. The spacer layer 190 may be formed by conformally coating a spacer material covering the top and sidewalls of the top electrode 172 and the capping layer 162.

Figure 6:
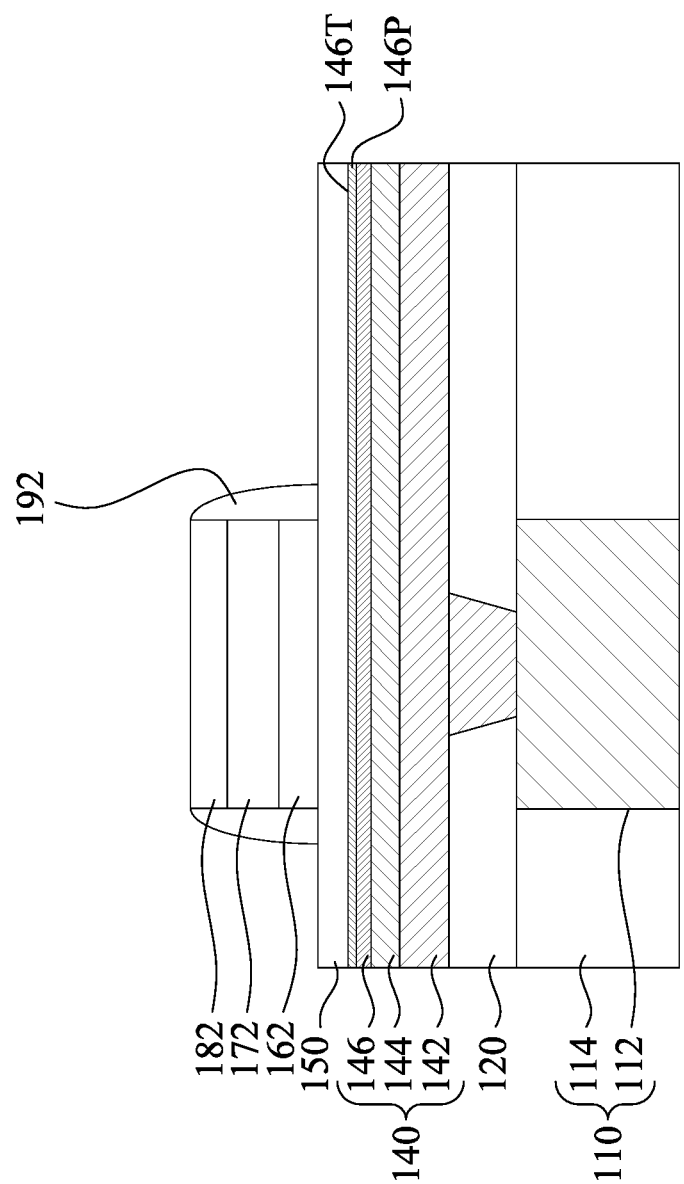

Reference is made to FIG. 6. An anisotropic etch process is performed to remove horizontal portions of the spacer layer 190 (referring to FIG. 5), and remain vertical portions of the spacer layer 190, thereby forming the spacer 192. The spacer 192 surrounds the hardmask 182, the top electrode 172, and the capping layer 162, and thus protects them against subsequent etch operations. The height and width of the spacer 192 after etching may be tuned by adjusting deposition and etching parameters.

According to various embodiments, the spacer etching is performed without patterning using a patterned mask because the shape of the conformal spacer material can be etched to form the spacer 192. However, other spacer shapes may be formed by patterning the spacer material using a patterned mask. If a patterned mask is used, the spacer 192 may be formed of suitable shapes. For example, the spacer 192 may include a portion over the hardmask 182 and the top corners of the hardmask 182 so as to further protect the memory structure during bottom electrode etch.

Figure 7:
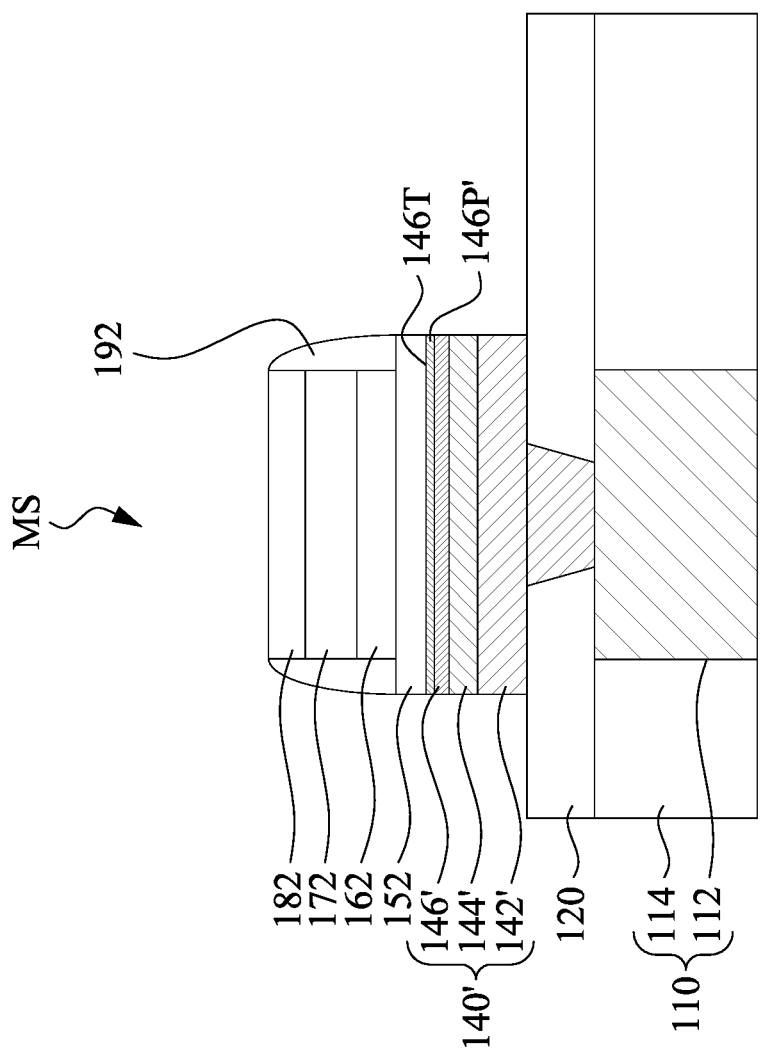

Then, reference is made to FIG. 7. The resistance switch layer 150, the metal-containing oxide layer 146P, the buffer layer 146, the second electrode layer 144, and the first electrode layer 142 (referring to FIG. 6) are patterned into a resistance switch element 152, a metal-containing oxide portion 146P', a buffer element 146', a second electrode 144', and a first electrode 142', respectively. The spacer 192 and the hardmask 182 are used as an etch mask to remove portions of the resistance switch layer 150, the buffer layer 146, the second electrode layer 144, and the first electrode layer 142 (referring to FIG. 6). In some embodiments, the buffer element 146', the second electrode 144', and the first electrode 142' in combination may be referred to as a bottom electrode 140'. Through the operations, a memory structure MS is formed, and the memory structure MS includes the bottom electrode 140', the metal-containing oxide portion 146P' over the bottom electrode 140', the resistance switch element 152 over the metal-containing oxide portion 146P', the capping layer 162 over the resistance switch element 152, the top electrode 172 over the capping layer 162, and the hardmask 182 over the top electrode 172.

In the present embodiments, the bottom electrode stack layer 140 (referring to FIG. 6) is patterned into the bottom electrode 140' after patterning the resistance switch layer 150 and the top electrode layer 170 (referring to FIG. 5) into the resistance switch element 152 and the top electrode 172. In some alternative embodiments, the bottom electrode stack layer 140 (referring to FIG. 5) may be patterned into the bottom electrode 140' prior to patterning the resistance switch layer 150 and the top electrode layer 170 (referring to FIG. 5) into the resistance switch element 152 and the top electrode 172. For example, the bottom electrode stack layer 140 (referring to FIG. 5) may be patterned into the bottom electrode 140', and then the resistance switch layer 150 and the top electrode layer 170 (referring to FIG. 5) are deposited over the bottom electrode 140' in some embodiments.

Figure 8:
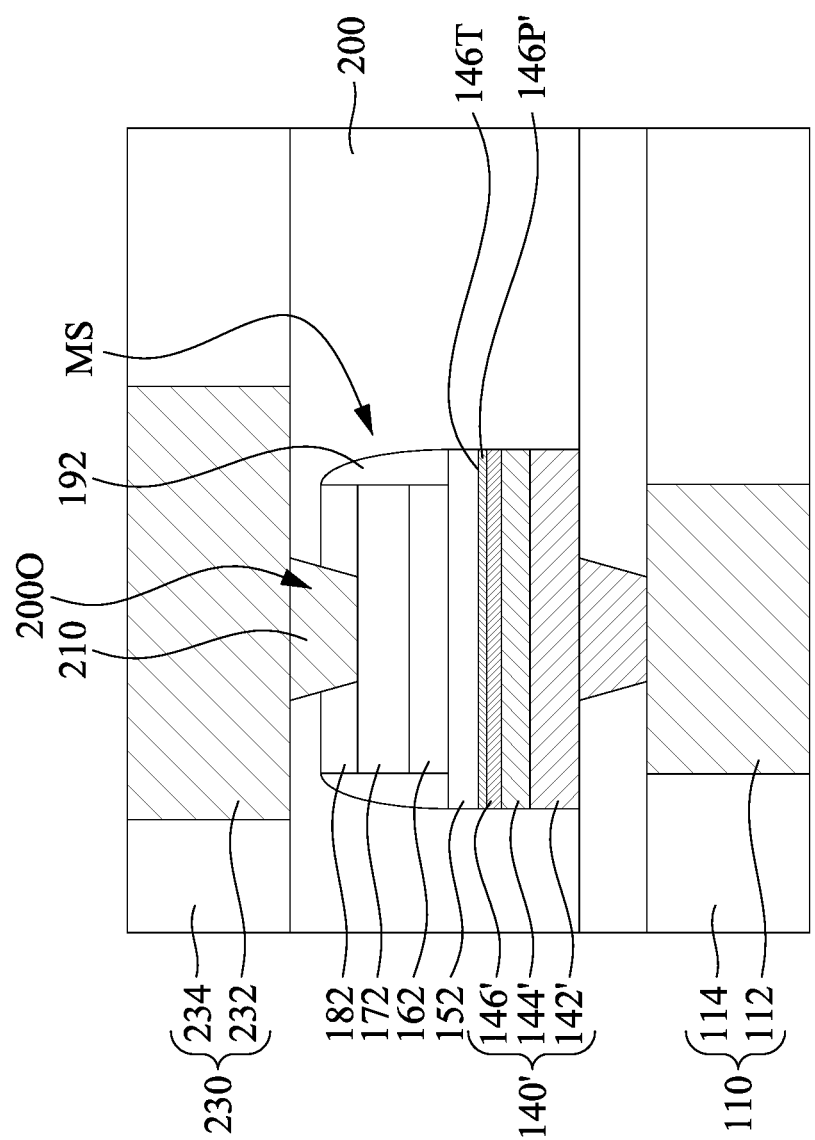

Reference is made to FIG. 8. An inter-layer dielectric layer 200 is deposited over the memory structure MS and the metal/dielectric layer 110 using suitable deposition techniques. The inter-layer dielectric layer 200 may be silicon oxide, extreme or extra low-k silicon oxide such as a porous silicon oxide layer, or other commonly used inter-layer dielectric material. After the formation of the inter-layer dielectric layer 200, a top electrode via 2000 are etched in the inter-layer dielectric layer 200 to expose a top electrode 172. Subsequently, the top electrode via 2000 is filled with a conductive feature 210, such as a metal. The filling may also include one or more liner and barrier layers in addition to a metal conductor. The liner and/or barrier may be conductive and deposited using CVD or PVD. The metal may be deposited using PVD or one of the plating methods, such as electrochemical plating. After the filling, a planarization process, such as chemical mechanical polishing (CMP), is performed to remove excess conductive feature 210.

A metal/dielectric layer 230 may be formed over the memory structure MS and the inter-layer dielectric layer 200, and the metal/dielectric layer 230 may include one or more conductive features 232 embedded in an inter-layer dielectric (ILD) layer 234. The ILD layer 234 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The conductive features 232 may be aluminum, aluminum alloy, copper, copper alloy, titanium, titanium nitride, tantalum, tantalum nitride, tungsten, cobalt, the like, and/or combinations thereof.

In some embodiments of the present disclosure, the surface treatment to the surface 146T may increase the amount of oxide vacancies in the resistance switch element 152 thereby improving a reliability of the memory structure MS. In some embodiments, the surface treatment to the surface 146T may further enlarge the difference between currents measured at the first data state (e.g., a '0') and the second data state (e.g., a '1'), which in turn may improve the operation window of the memory device.

Figure 9:
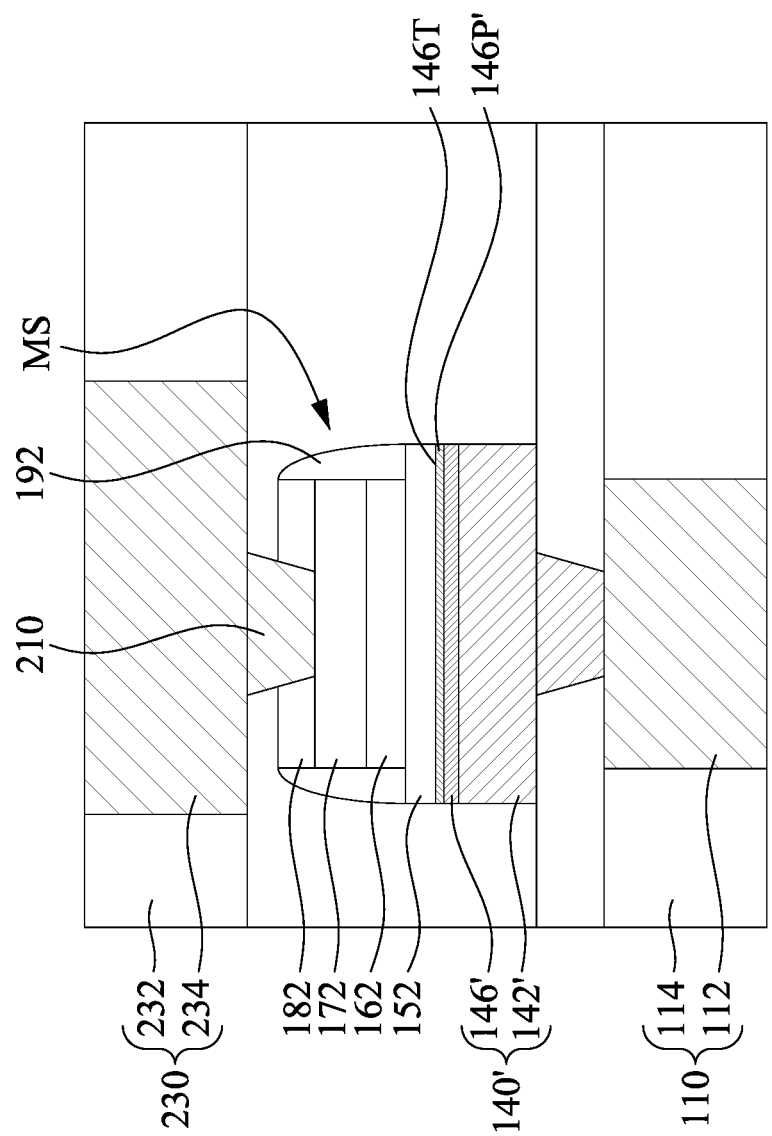
FIG. 9 is a cross-sectional view of a memory device in accordance with some embodiments of the present disclosure.

FIG. 9 is a cross-sectional view of a memory device in accordance with some embodiments of the present disclosure. The details of the present embodiments are similar to that of the embodiments of FIGS. 1-8, except the configuration of the bottom electrode 140'. In the present embodiments, the bottom electrode 140' may not include the second electrode 144'. For example, in the present embodiments, a bottom surface of the buffer element 146' is directly in contact with a top surface of the first electrode 142'. Other details of the present embodiments are similar to those described above, and therefore not repeated herein.

Figure 10:
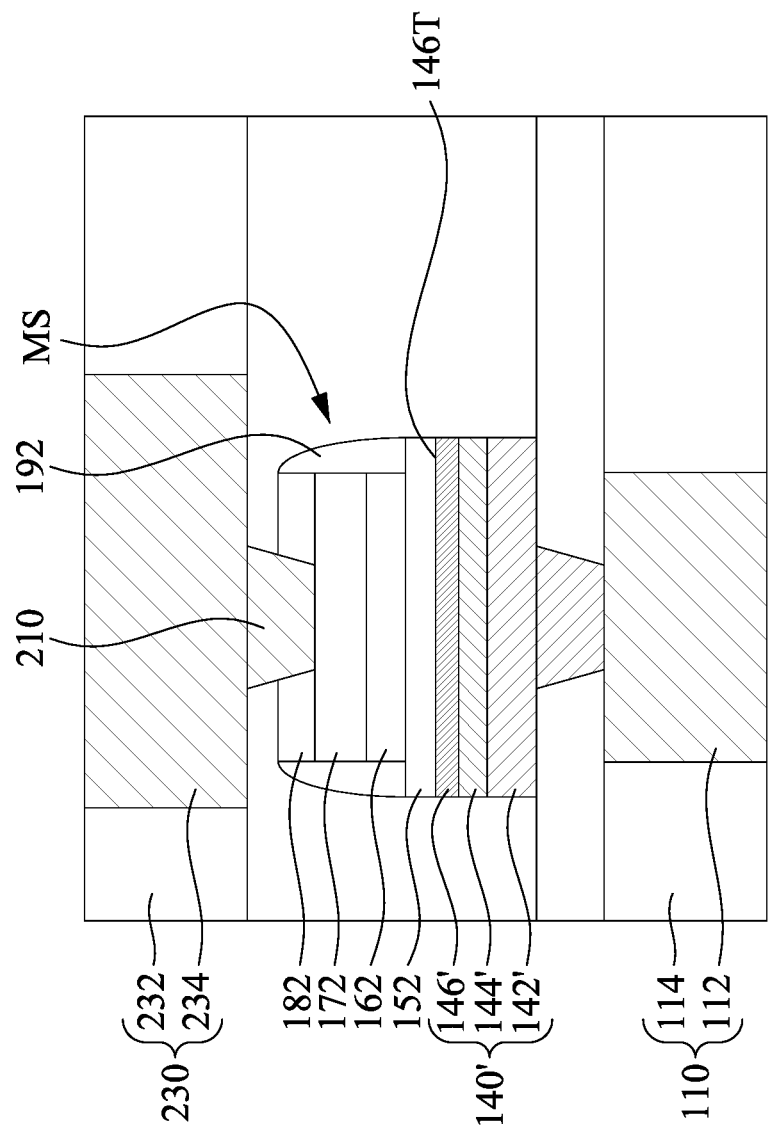
FIG. 10 is a cross-sectional view of a memory device in accordance with some embodiments of the present disclosure.

FIG. 10 is a cross-sectional view of a memory device in accordance with some embodiments of the present disclosure. The configuration of the present embodiments are similar to that of the embodiments of FIGS. 1-8, except that the surface treatment performed to the top surface 146T of the buffer layer 146 (referring to FIG. 1) may not form a observable metal-containing oxide portion. That is, the formed memory structure MS may not include an observable metal-containing oxide portion that has a same metal as that included in the buffer element 146' between the buffer element 146' of the bottom electrode 140' and the resistance switch element 152. For example, in the present embodiments, a bottom surface of the resistance switch element 152 is directly in contact with a top surface of the buffer element 146', without a TaO layer therebetween. Other details of the present embodiments are similar to those described above, and therefore not repeated herein.

FIGS. 11-17 illustrate various stages in the formation of a memory device according to some embodiments of the present disclosure. The configurations of the present embodiments are similar to that of the embodiments of FIGS. 1-8, except the shapes of the stacked layers. For example, the stacked layers have a recess profile corresponding to the openings O1 in the dielectric layer 120. The illustration is merely exemplary and is not intended to limit beyond what is specifically recited in the claims that follow. It is understood that additional operations may be provided before, during, and after the operations shown by FIGS. 11-17, and some of the operations described below can be replaced or eliminated for additional embodiments of the method. The order of the operations/processes may be interchangeable.

Figure 11:
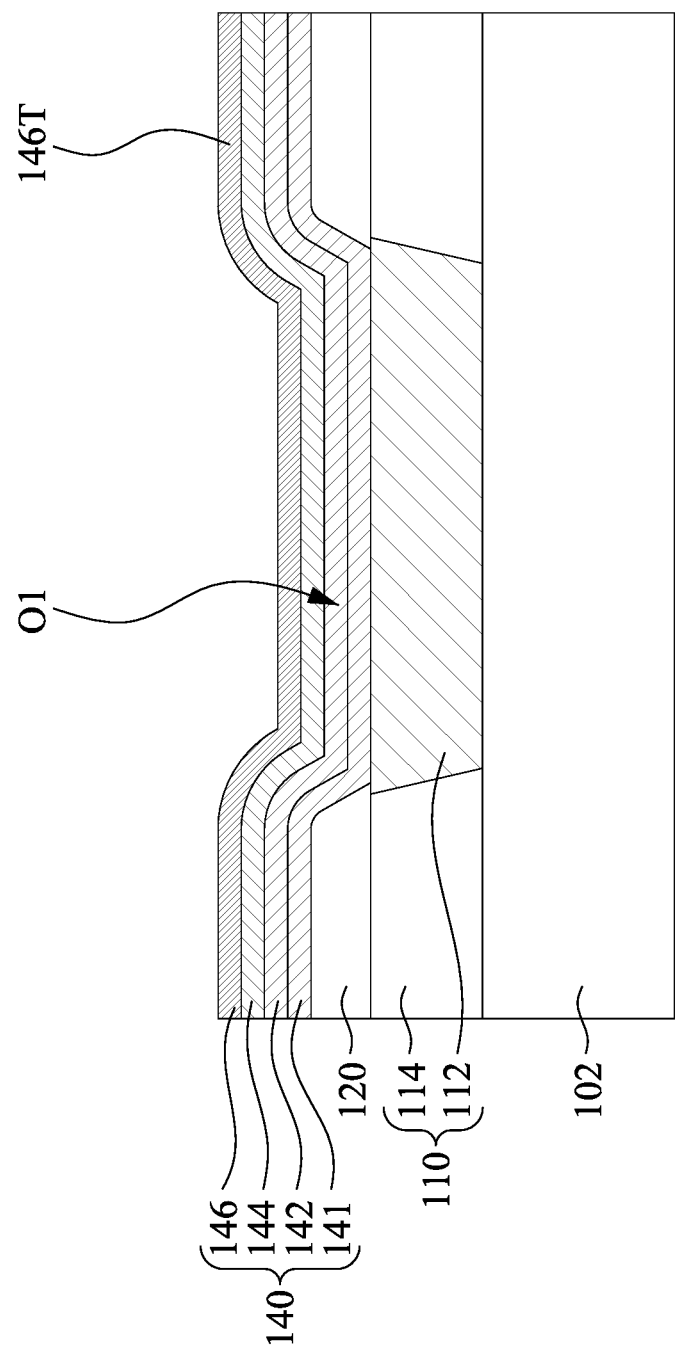
FIGS. 11-17 illustrate various stages in the formation of a memory device according to some embodiments of the present disclosure.

FIG. 11 illustrates a semiconductor substrate 102 having transistors and one or more metal/dielectric layers 110 thereon. The semiconductor substrate 102 may be a silicon substrate. Alternatively, the substrate 102 may include another elementary semiconductor, such as germanium; a compound semiconductor including silicon carbide; an alloy semiconductor including silicon germanium; or combinations thereof. In some embodiments, the substrate 102 is a semiconductor on insulator (SOI) substrate. The substrate 102 may include doped regions, such as p-wells and n-wells. The transistors are formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers 110 of a multi-level interconnect (MLI) is formed over the transistors. The metal/dielectric layer 110 includes one or more conductive features 112 embedded in an inter-layer dielectric (ILD) layer 114.

In the present embodiments, a dielectric layer 120 is formed on the metal/dielectric layer 110, and an opening O1 is etched in the dielectric layer 120 to expose a portion of the conductive feature 112 in the metal/dielectric layer 110. The dielectric layer 120 may include suitable dielectric material, such as silicon oxide.

Subsequently, a bottom electrode stack layer 140 is deposited over the dielectric layer 120 and filling the opening O1. In some embodiments, the bottom electrode stack layer 140 can be a single-layered structure or a multi-layered structure. For example, the bottom electrode stack layer 140 includes a diffusion barrier layer 141, a first electrode layer 142 over the diffusion barrier layer 141, a second electrode layer 144 over the first electrode layer 142, and a buffer layer 146 over the second electrode layer 144.

In some embodiments, the diffusion barrier layer 141 is a titanium nitride (TiN) layer or a tantalum nitride (TaN) layer, which can act as a suitable barrier to prevent metal diffusion. Formation of the diffusion barrier layer 141 may be exemplarily performed using CVD, PVD, ALD, the like, and/or a combination thereof.

In some embodiments, the first electrode layer 142 may include titanium (Ti), tantalum (Ta), platinum (Pt), ruthenium (Ru), tungsten (W), aluminum (Al), copper (Cu), TiN, TaN, the like, and/or combinations thereof. Formation of the first electrode layer 142 may be exemplarily performed using CVD, PVD, ALD, the like, and/or a combination thereof.

In some embodiments, the second electrode layer 144 may include Ru, Ti, W, Ni, Al, Pd, or Co, or the combination thereof. In some embodiments, the second electrode layer 144 may be more inactive than the first electrode layer 142. For example, the second electrode layer 144 may be more inert to oxygen than the first electrode layer 142 is. In some embodiments, the second electrode layer 144 may include noble metals, while the first electrode layer 142 may include non-noble metals. For example, the second electrode layer 144 may include Ru, Pd, or the like, and the first electrode layer 142 may include Ti, Ta, Al, W, TiN, TaN or the like. The second electrode layer 144 may be deposited by ALD. Alternatively, the second electrode layer 144 is deposited by an electroless plating process or other suitable process.

In some embodiments, the buffer layer 146 is formed over the second electrode layer 144. In some embodiments, the buffer layer 146 may be more active than the second electrode layer 144. For example, in some embodiments, the buffer layer 146 may include non-noble metals, while the second electrode layer 144 may include noble metals. For example, the buffer layer 146 may include tantalum, TaN, or the combination thereof. The buffer layer 146 may deposited by ALD. Alternatively, the buffer layer 146 is deposited by an electroless plating process or other suitable process.

In the present embodiments, the diffusion barrier layer 141, the first and second electrode layer 142 and 144, and the buffer layer 146 of the bottom electrode stack layer 140 have profiles conforming to the opening O1 in the dielectric layer 120. For example, each of the diffusion barrier layer 141, the first and second electrode layer 142 and 144, and the buffer layer 146 has a first portion in the opening O1 in the dielectric layer 120 and a second portion over a top surface of the dielectric layer 120. In other word, each of the diffusion barrier layer 141, the first and second electrode layer 142 and 144, and the buffer layer 146 has a recess above the opening O1 in the dielectric layer 120.

Figure 12:
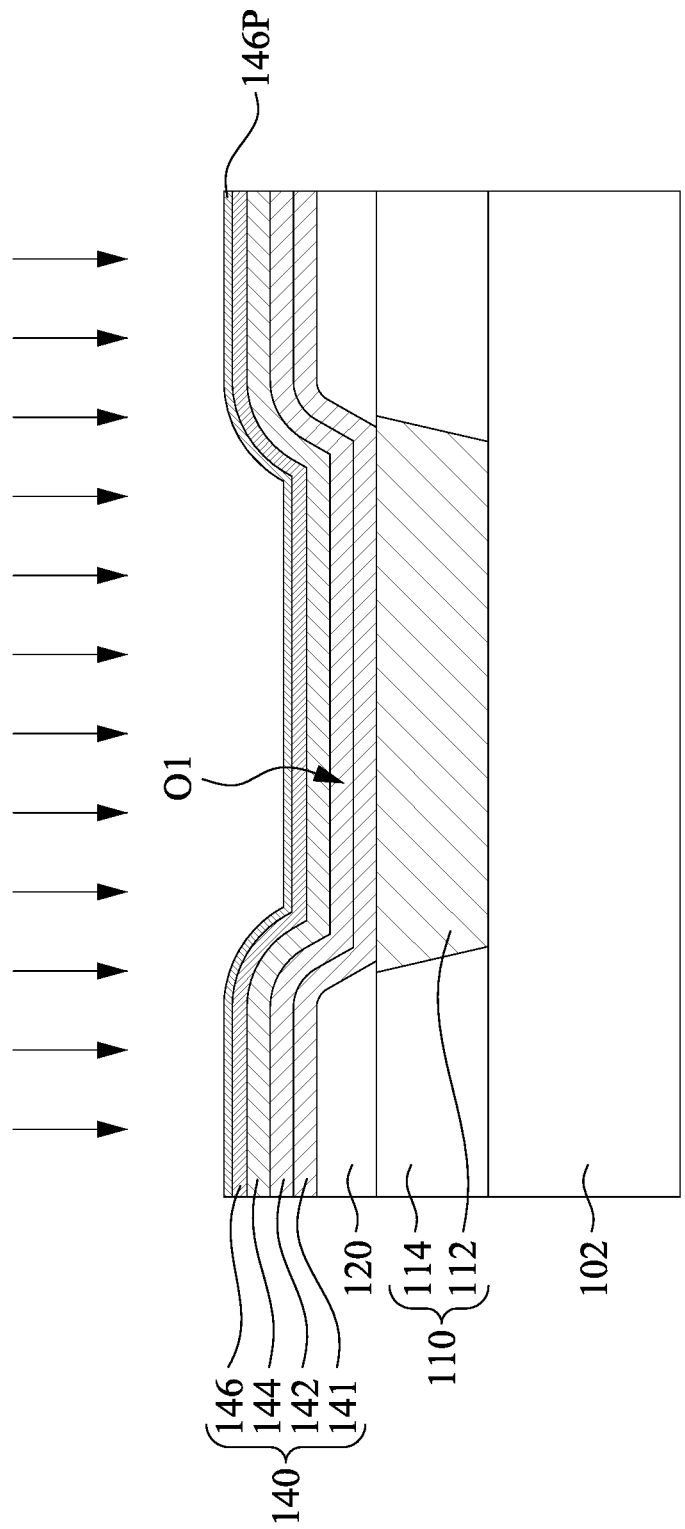

Reference is made to FIG. 12. A surface treatment is performed to a top surface 146T of the buffer layer 146 by inducing a gas or plasma to the top surface 146T of the buffer layer 146. The gas or plasma may include oxide-containing gas or nitrogen-containing gas. For example, the gas or plasma may include $O_2$ or $N_2O$. In some embodiments, the surface treatment may be performed in ex-situ chamber after the formation of the buffer layer 146. After the surface treatment, the top surface 146T of the buffer layer 146 may include defects, such as dangling bonds or oxide vacancies. In other word, the surface treatment may create oxide vacancies over a top surface of the bottom electrode stack layer 140.

In some embodiments, the surface treatment may oxidize a top portion of the buffer layer 146 adjoining the top surface 146T. The oxidized top portion of the buffer layer 146 may referred to as a metal-containing oxide layer 146P hereinafter. The metal-containing oxide layer 146P may have a same metal as that included in the buffer layer 146. For example, while the buffer layer 146 include tantalum or TaN, the metal-containing oxide layer 146P may include TaO. In the present embodiments, the metal-containing oxide layer 146P may has a profile conforming to the opening O1 in the dielectric layer 120. For example, the metal-containing oxide layer 146P has a first portion in the opening O1 in the dielectric layer 120 and a second portion over the top surface of the dielectric layer 120. In other word, the metal-containing oxide layer 146P has a recess above the opening O1 in the dielectric layer 120. In some embodiments, a bottom surface of the metal-containing oxide layer 146P is higher than a top surface of the dielectric layer 120.

Figure 13:
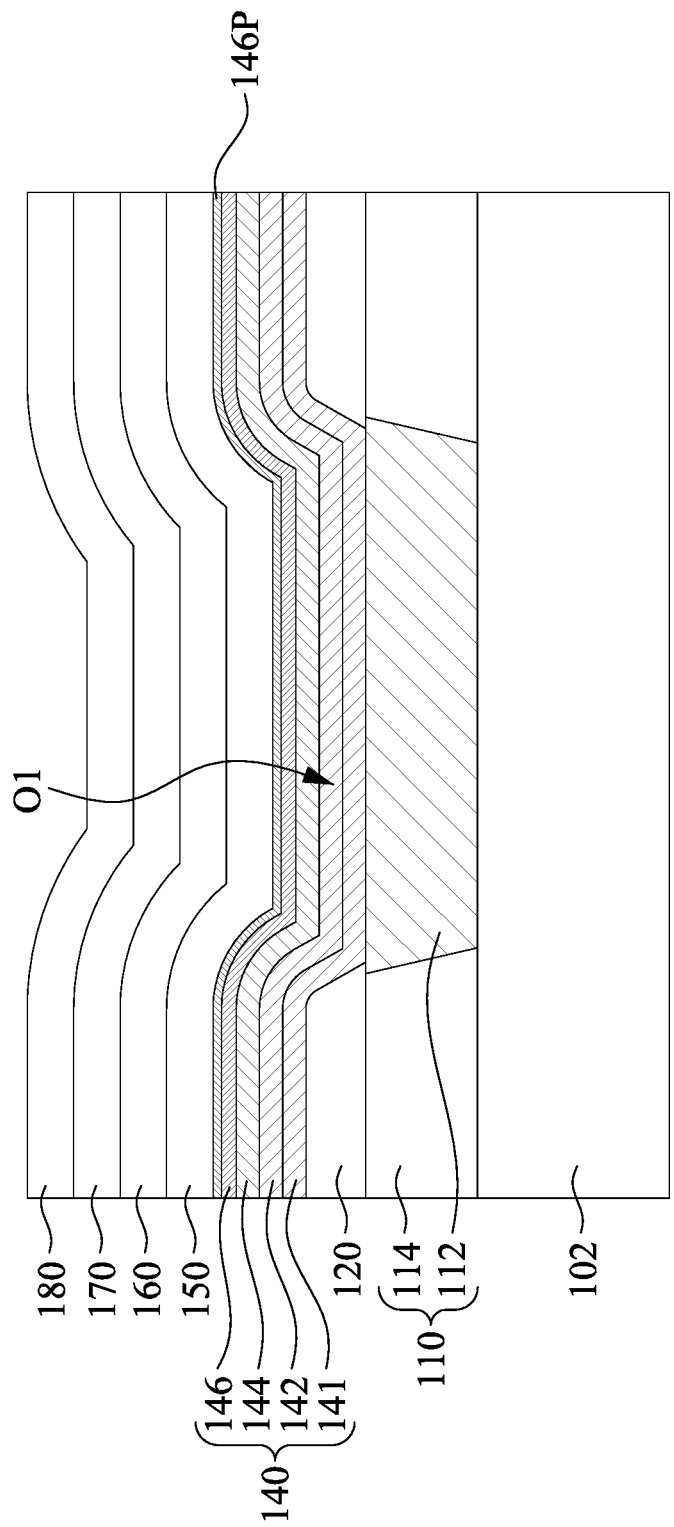

Reference is made to FIG. 13. A resistance switch layer 150, a capping layer 160, a top electrode layer 170, and a hardmask layer 180 are subsequently formed on the top surface 146T. In some embodiments, the resistance switch layer 150 is a metal oxide, which may be hafnium oxide, zirconium oxide, aluminum oxide, nickel oxide, tantalum oxide, titanium oxide, and other oxides used as a resistance switch layer. The metal oxide may have a non-stoichiometric oxygen to metal ratio. Depending on the method of deposition, the oxygen to metal ratio and other process conditions may be tuned to achieve specific resistance switch layer 150 properties. For example, a set of conditions may yield a low 'forming' voltage and another set of conditions may yield a low 'read' voltage. In some embodiments of the present disclosure, by increasing the amount of oxide vacancies of the surface 146T where the resistance switch layer 150 is formed on, the amount of oxide vacancies in the resistance switch layer 150 is increased, thereby improving a reliability of the RRAM device to be formed. Other details regarding the formation of these layers are similar to those illustrated above, and therefore not repeated herein.

Figure 14:
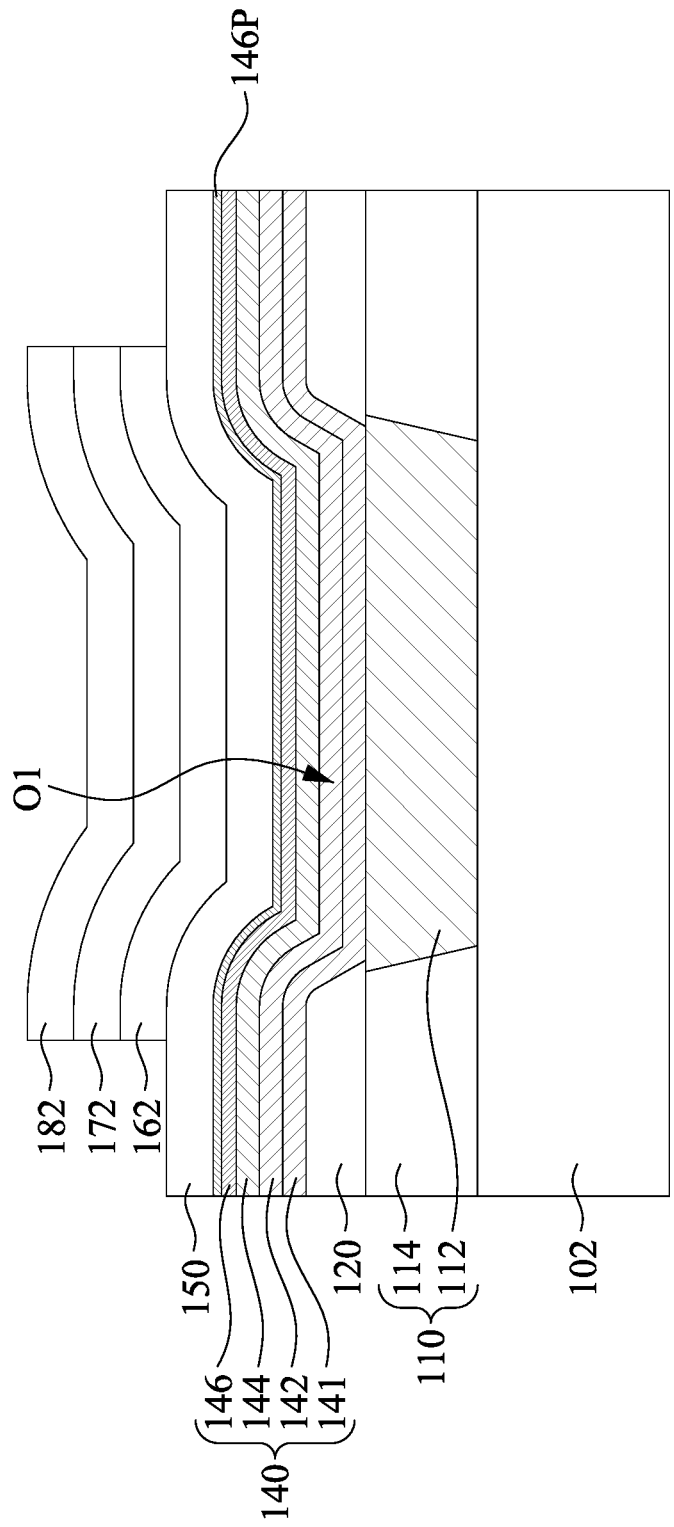

Reference is made to FIG. 14. The hardmask layer 180, the top electrode layer 170, and the capping layer 160 (referring to FIG. 13) are patterned into a hardmask 182, a top electrode 172, a capping layer 162, respectively. The patterning process may include suitable photolithography and etching operations. Other details regarding the patterning process are similar to those illustrated above, and therefore not repeated herein.

Figure 15:
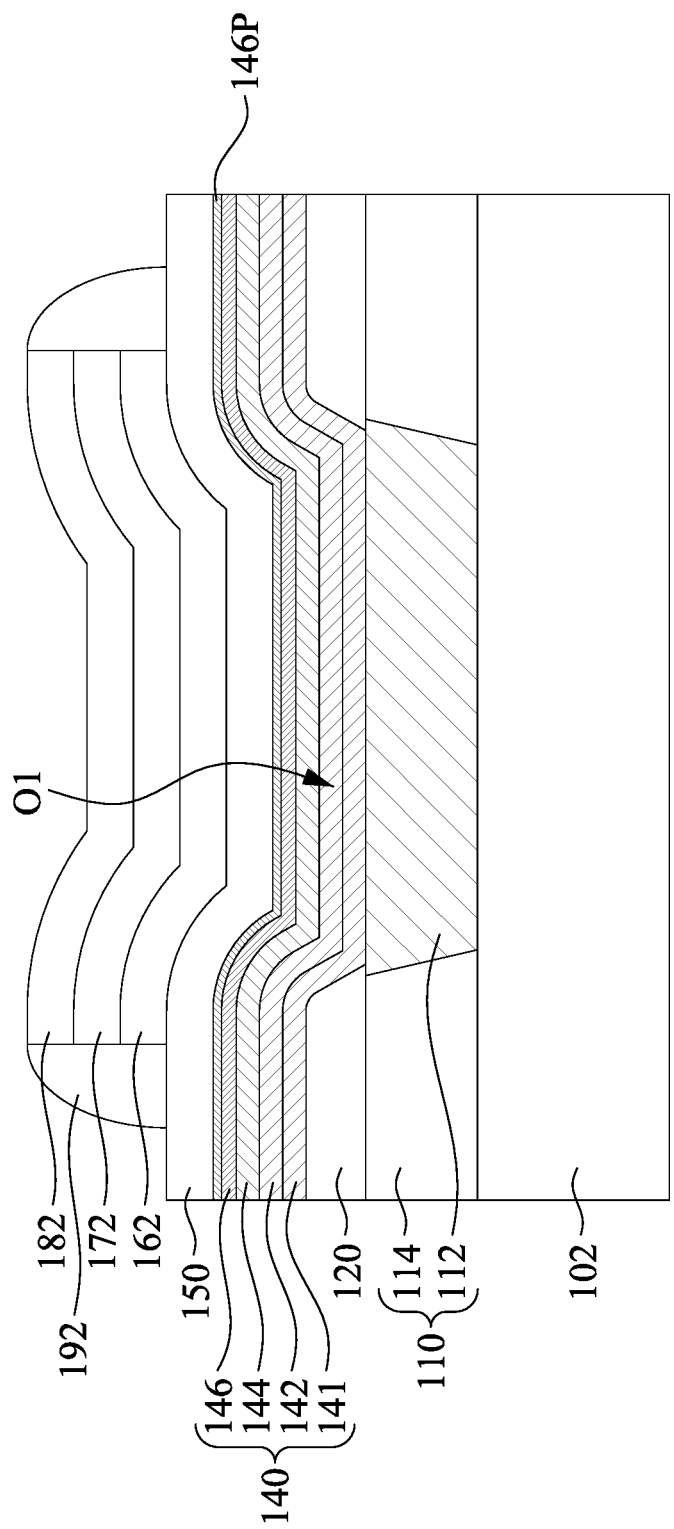

Reference is made to FIG. 15. A spacer 192 is formed to surrounds the hardmask 182, the top electrode 172, and the capping layer 162, and thus protects them against subsequent etch operations. The spacer 192 may be made of silicon nitride, silicon oxynitride, and silicon oxide. Formation of the spacer 192 may include depositing a spacer layer over the structure of FIG. 14, and then removing portions of the spacer layer by anisotropic etching process. Other details regarding the formation of the spacer 192 are illustrated above, and therefore not repeated herein.

Figure 16:
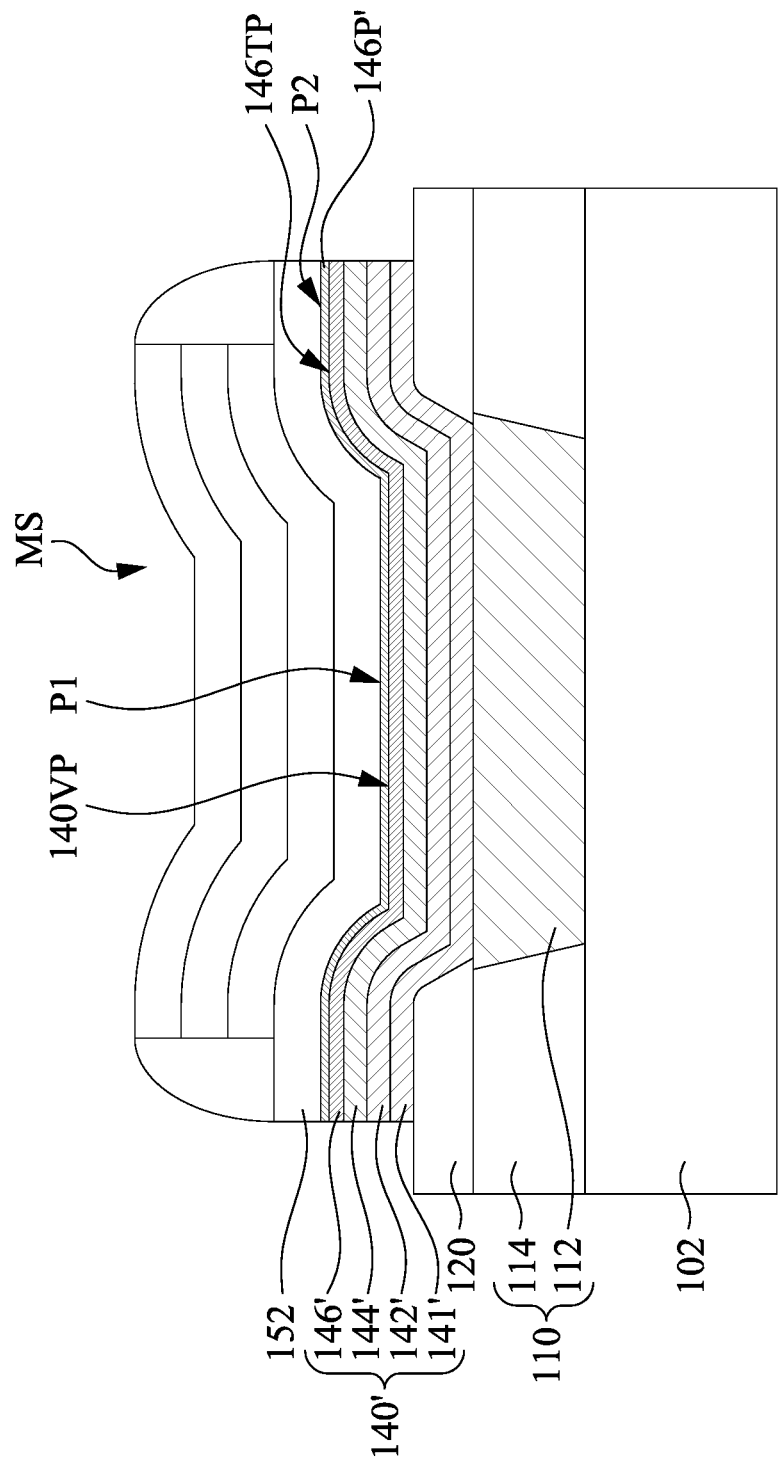

Reference is made to FIG. 16. The resistance switch layer 150, the metal-containing oxide layer 146P, the buffer layer 146, the second electrode layer 144, the first electrode layer 142, and the diffusion barrier layer 141 (referring to FIG. 15) are patterned into a resistance switch element 152, a metal-containing oxide portion 146P', a buffer element 146', a second electrode 144', a first electrode 142', and a diffusion barrier layer 141', respectively. The spacer 192 and the hardmask 182 are used as an etch mask to remove portions of the resistance switch layer 150, the buffer layer 146, the second electrode layer 144, the first electrode layer 142, and the diffusion barrier layer 141 (referring to FIG. 15). In some embodiments, the buffer element 146', the second electrode 144', the first electrode 142', and the diffusion barrier layer 141' in combination may be referred to as a bottom electrode 140'. Through the operations, a memory structure MS is formed, and the memory structure MS includes the bottom electrode 140', the resistance switch element 152, the capping layer 162, the top electrode 172, and the hardmask 182.

In the present embodiments, the bottom electrode 140' has a via portion 140VP in the dielectric layer 120 and a top portion 140TP over a top surface of the dielectric layer 120. The metal-containing oxide portion 146P' has a first portion P1 over the via portion 140VP of the bottom electrode 140' and a second portion P2 over the top portion 140TP of the bottom electrode 140', and a top surface of the second portion P2 of the metal-containing oxide portion 146P' is higher than a top surface of the first portion P1 of the metal-containing oxide portion 146P'. In some embodiments, a bottom surface of the first portion P1 of the metal-containing oxide portion 146P' is higher than a top surface of the dielectric layer 120.

Figure 17:
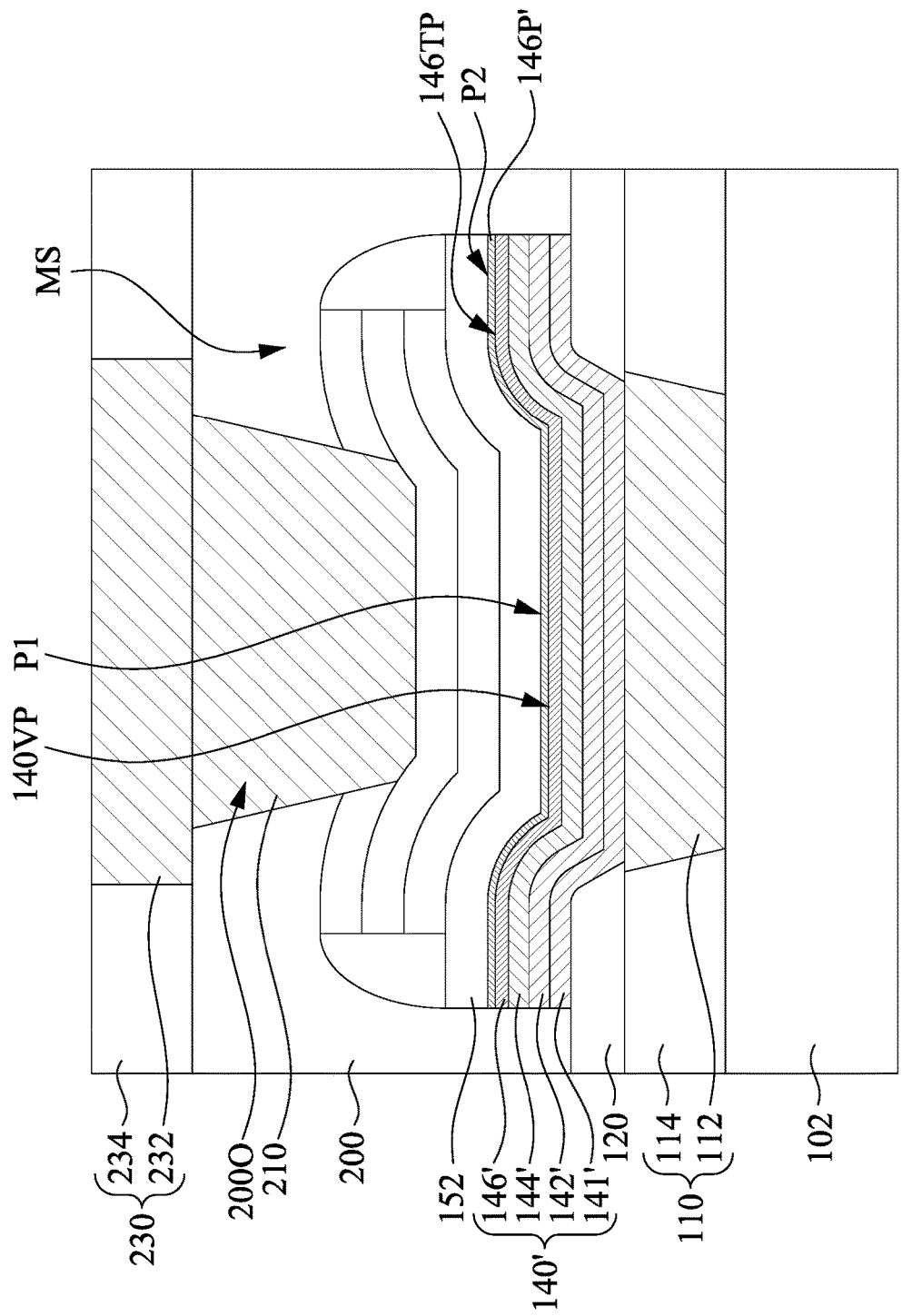

Reference is made to FIG. 17. An inter-layer dielectric layer 200 is deposited over the memory structure MS and the metal/dielectric layer 110 using suitable deposition techniques. After the formation of the inter-layer dielectric layer 200, a top electrode via 200O is etched in the inter-layer dielectric layer 200 to expose a top electrode 172. Subsequently, the top electrode via 200O is filled with a conductive feature 210, such as a metal. The filling may also include one or more liner and barrier layers in addition to a metal conductor. A metal/dielectric layer 230 may be formed over the memory structure MS, and the metal/dielectric layer 230 may include one or more conductive features 232 embedded in an inter-layer dielectric (ILD) layer 234. Other details of the present embodiments are similar to those illustrated above, and therefore not repeated herein.

Figure 18:
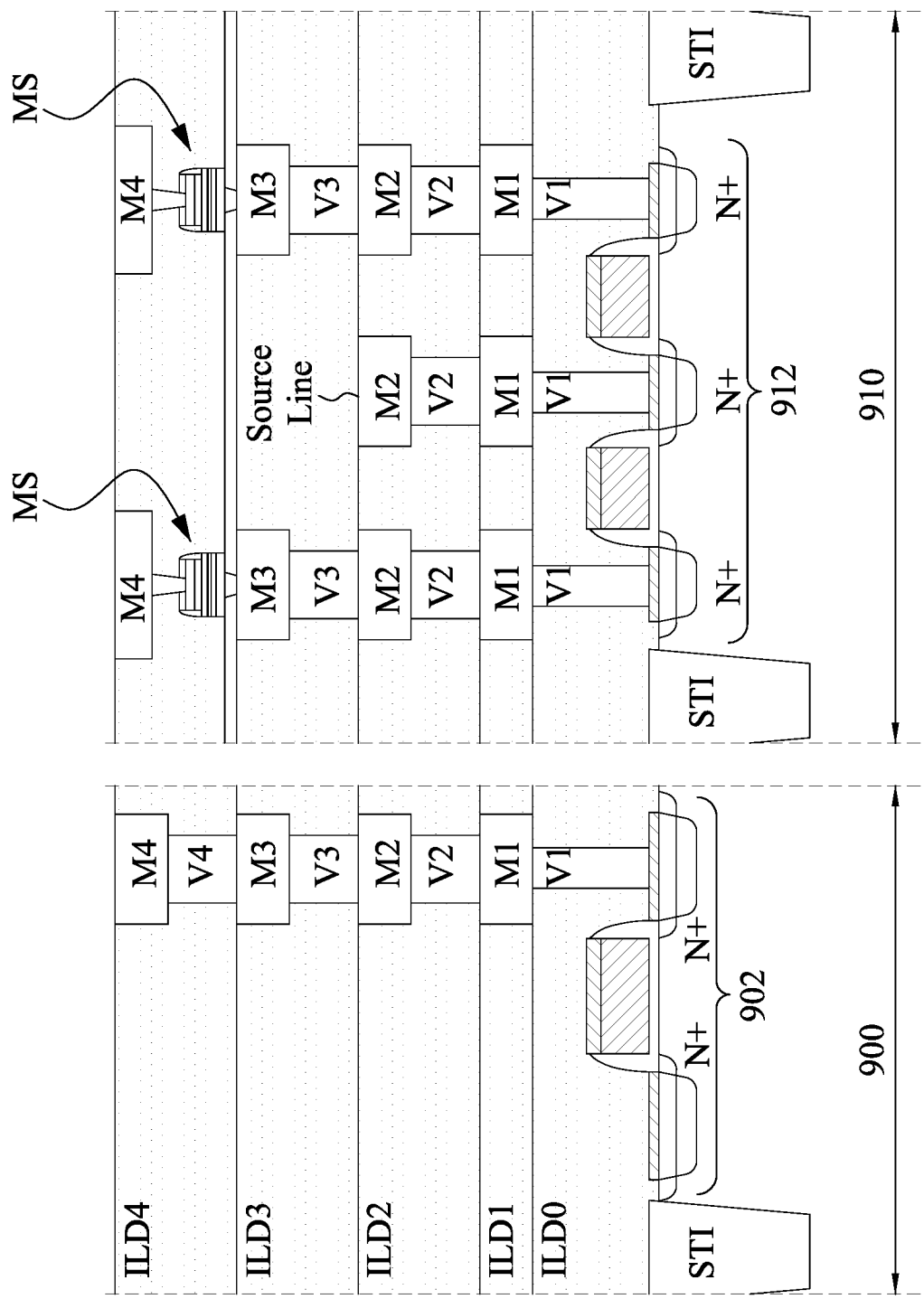
FIG. 18 is a cross-sectional view of a memory device in accordance with some embodiments of the present disclosure.

FIG. 18 is a cross-sectional view of a semiconductor device in accordance with some embodiments of the present disclosure. The semiconductor device includes a logic region 900 and a memory region 910. Logic region 900 may include circuitry, such as an exemplary logic transistor 902, for processing information received from the memory structures MS in the memory region 910 and for controlling reading and writing functions of the memory structures MS. In some embodiments, the memory structures MS may be similar to those shown above.

As depicted, the semiconductor device is fabricated using four metallization layers, labeled as M1 through M4, with four layers of metallization vias or interconnects, labeled as V1 through V4. Other embodiments may contain more or fewer metallization layers and a corresponding more or fewer number of vias. Logic region 900 includes a full metallization stack, including a portion of each of metallization layers M1-M4 connected by interconnects V2-V4, with the interconnect V1 connecting the stack to a source/drain contact of logic transistor 902. The memory region 910 includes a full metallization stack connecting memory structures MS to transistors 912 in the memory region 910, and a partial metallization stack connecting a source line to transistors 912 in the memory region 910. Memory structures MS are depicted as being fabricated in between the top of the metallization layer M3 and the bottom of the metallization layer M4. Also included in semiconductor device is a plurality of ILD layers. Five ILD layers, identified as ILD0 through ILD4 are depicted in FIG. 18 as spanning the logic region 900 and the memory region 910. The ILD layers may provide electrical insulation as well as structural support for the various features of the semiconductor device during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the amount of oxide vacancies in the resistance switch layer is increased by the surface treatment to its underlying layer (e.g., the bottom electrode), such that it can be easier to pull the oxygen back to the resistance switch layer to subsequently break the conductive filament, thereby improving the cycle reliability of the RRAM device. Another advantage is that the surface treatment further enlarges the difference between currents measured at the first data state (e.g., a '0') and the second data state (e.g., a '1'), which in turn may improve the operation window of the memory device. In some embodiments, the surface treatment to the underlying layer may form an observable metal-containing oxide portion.

According to some embodiments of the present disclosure, a method for fabricating a memory device is provided. The method includes forming a bottom electrode layer over a substrate; forming a buffer layer over the bottom electrode layer; performing a surface treatment to a top surface of the buffer layer; depositing a resistance switch layer over the top surface of the buffer layer after performing the surface treatment; forming a top electrode over the resistance switch layer; and patterning the resistance switch layer into a resistance switch element below the top electrode.

According to some embodiments of the present disclosure, a method for fabricating a memory device is provided. The method includes forming a bottom electrode layer over a substrate; turning a top portion of the bottom electrode layer into a metal-containing oxide layer by introducing an oxide-containing gas to the top portion of the bottom electrode layer; depositing a resistance switch layer over the metal-containing oxide layer; forming a top electrode over the resistance switch layer; and patterning the resistance switch layer into a resistance switch element over the metal-containing oxide layer.

According to some embodiments of the present disclosure, a memory device includes a bottom electrode, a buffer element, a metal-containing oxide portion, a resistance switch element, and a top electrode. The buffer element is over the bottom electrode. The metal-containing oxide portion is over the buffer element, in which the metal-containing oxide portion has a same metal material as that of the buffer element. The resistance switch element is over the metal-containing oxide portion. The top electrode is over the resistance switch element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a memory device, comprising:
    forming a bottom electrode via in a dielectric layer over a substrate;
    depositing a bottom electrode layer over the substrate, wherein the bottom electrode layer comprises a non-noble metal layer and a noble metal layer over the non-noble metal layer, and each of the non-noble metal layer and the noble metal layer comprises a first portion over the bottom electrode via and a second portion over the dielectric layer;
    depositing a buffer layer over the first and second portions of the noble metal layer of the bottom electrode layer;
    performing a surface treatment to a top surface of the buffer layer;
    depositing a resistance switch layer over the top surface of the buffer layer after performing the surface treatment;
    forming a top electrode over the resistance switch layer; and
    patterning the resistance switch layer into a resistance switch element below the top electrode.

2. The method of claim 1, wherein performing the surface treatment comprises:
    introducing an oxide-containing gas to the top surface of the buffer layer.

3. The method of claim 1, wherein performing the surface treatment comprises:
    introducing a nitrogen-containing gas to the top surface of the buffer layer.

4. The method of claim 1, wherein the surface treatment is performed such that a top portion of the buffer layer is turned into a metal-containing oxide layer.

5. The method of claim 4, wherein the surface treatment is performed such that the metal-containing oxide layer comprises a same metal as that of the buffer layer.

6. The method of claim 1, wherein depositing the resistance switch layer is performed such that the resistance switch layer is in contact with the top surface of the buffer layer.

7. The method of claim 1, wherein the surface treatment is performed such that the top surface of the buffer layer has dangling bonds.

8. The method of claim 1, further comprising:
    patterning the buffer layer and the bottom electrode layer respectively into a buffer element and a bottom electrode below the resistance switch element after patterning the resistance switch layer.

9. A method for fabricating a memory device, comprising:
    forming an opening in a dielectric layer;
    forming a bottom electrode stack layer over a substrate, wherein the bottom electrode stack layer comprises a bottom electrode layer and a buffer layer over the bottom electrode layer, the bottom electrode stack layer fills the opening in the dielectric layer, and an entirety of a top surface of the bottom electrode stack layer is higher than a top surface of the dielectric layer, wherein the bottom electrode layer comprises a first bottom electrode layer over and in contact with the dielectric layer and a second bottom electrode layer over the first bottom electrode layer, the first bottom electrode layer comprises a first non-noble metal, the second bottom electrode layer comprises a noble metal, and the first bottom electrode layer spaces an entirety of a bottom surface of the second bottom electrode layer from the dielectric layer;

turning a top portion of the buffer layer into a metal-containing oxide layer by introducing an oxide-containing gas to the top portion of the buffer layer;

depositing a resistance switch layer over the metal-containing oxide layer;

forming a top electrode over the resistance switch layer; and patterning the resistance switch layer into a resistance switch element over the metal-containing oxide layer.

10. The method of claim 9, further comprising:

patterning the metal-containing oxide layer into a metal-containing oxide portion below the resistance switch element after patterning the resistance switch layer.

11. The method of claim 9, wherein turning the top portion of the buffer layer into the metal-containing oxide layer is performed such that the metal-containing oxide layer has a recess above the opening in the dielectric layer.

12. The method of claim 9, wherein turning the top portion of the buffer layer into the metal-containing oxide layer is performed such that a bottom surface of the metal-containing oxide layer is higher than the top surface of the dielectric layer.

13. The method of claim 9, wherein turning the top portion of the buffer layer into the metal-containing oxide layer is performed such that the metal-containing oxide layer comprises a second non-noble metal.

14. The method of claim 9, wherein depositing the resistance switch layer is performed such that the resistance switch layer is spaced apart from the bottom electrode stack layer by the metal-containing oxide layer.

15. A method for fabricating a memory device, comprising:

depositing a dielectric layer over a substrate;

depositing a first bottom electrode layer over and in contact with the dielectric layer, wherein the first bottom electrode layer comprises a first non-noble metal;

depositing a second bottom electrode layer over the first bottom electrode layer, wherein the second bottom electrode layer comprises a noble metal, and the first bottom electrode layer spaces an entirety of a bottom surface of the second bottom electrode layer from the dielectric layer;

depositing a buffer layer over the second bottom electrode layer, wherein the buffer layer comprises a second non-noble metal;

exposing a top surface of the buffer layer to an oxygen-containing gas;

depositing a resistance switch layer over the top surface of the buffer layer after exposing the top surface of the buffer layer to the oxygen-containing gas; and patterning the resistance switch layer into a resistance switch element.

16. The method of claim 15, wherein exposing the top surface of the buffer layer to the oxygen-containing gas is performed such that the top surface of the buffer layer has a plurality of defects.

17. The method of claim 15, wherein depositing the buffer layer is performed such that a thickness of the buffer layer is less than a thickness of the second bottom electrode layer.

18. The method of claim 15, wherein the oxygen-containing gas is $O_2$, and exposing the top surface of the buffer layer to the oxygen-containing gas is performed in a chemical vapor deposition (CVD) chamber with a power ranging from about 5 W to about 800 W and a time duration ranging from about 3 seconds to about 50 seconds.

19. The method of claim 15, wherein the oxygen-containing gas is $N_2O$, and exposing the top surface of the buffer layer to the oxygen-containing gas is performed in a chemical vapor deposition (CVD) chamber with a power ranging from about 5 W to about 600 W and a time duration ranging from about 3 seconds to about 50 seconds.

20. The method of claim 15, further comprising:

etching an opening in the dielectric layer, wherein depositing the first bottom electrode layer is performed such that the first bottom electrode layer is at least partially in the opening in the dielectric layer.

* * * * *